United States Patent [19]

Carter et al.

[11] Patent Number: 5,895,263
[45] Date of Patent: Apr. 20, 1999

[54] PROCESS FOR MANUFACTURE OF INTEGRATED CIRCUIT DEVICE

[75] Inventors: Kenneth Raymond Carter; Daniel Joseph Dawson; Richard Anthony DiPietro, all of San Jose; Craig Jon Hawker, Los Gatos; James Lupton Hedrick, Pleasanton; Robert Dennis Miller, San Jose; Do Yeung Yoon, Los Gatos, all of Calif.

[73] Assignee: International Business Machines Corporation, Armonk, N.Y.

[21] Appl. No.: 08/770,620

[22] Filed: Dec. 19, 1996

[51] Int. Cl.⁶ .................................. H01L 21/28
[52] U.S. Cl. ............... 438/624; 438/624; 438/623; 438/781; 438/790; 438/633
[58] Field of Search .................... 438/624, 623, 438/780, 781, 782, 633, 789, 790; 257/759, 760

[56] References Cited

U.S. PATENT DOCUMENTS

| | | |
|---|---|---|
| 3,547,839 | 12/1970 | Tocker et al. ............... 260/2.5 |
| 3,732,181 | 5/1973 | Ray et al. . |
| 3,900,320 | 8/1975 | Rolker et al. . |
| 3,917,761 | 11/1975 | Scheuerlein et al. ............... 264/41 |
| 4,141,877 | 2/1979 | Luttinger et al. . |
| 4,457,972 | 7/1984 | Griffith et al. ............... 428/334 |
| 4,535,099 | 8/1985 | Lee et al. . |
| 4,623,463 | 11/1986 | Ford et al. ............... 210/500.29 |
| 4,761,233 | 8/1988 | Linder et al. ............... 210/500.37 |
| 4,920,402 | 4/1990 | Nakaya et al. . |
| 5,036,145 | 7/1991 | Echterling et al. . |
| 5,043,369 | 8/1991 | Bahn et al. . |
| 5,114,826 | 5/1992 | Kwong et al. . |
| 5,130,025 | 7/1992 | Lefebvre et al. ............... 210/638 |
| 5,183,607 | 2/1993 | Beall et al. ............... 264/41 |
| 5,198,203 | 3/1993 | Kresge et al. ............... 423/718 |
| 5,206,337 | 4/1993 | Takeda et al. . |
| 5,252,654 | 10/1993 | David et al. . |
| 5,288,842 | 2/1994 | Feger et al. . |
| 5,304,515 | 4/1994 | Morita et al. ............... 438/781 |
| 5,384,376 | 1/1995 | Tunney et al. . |
| 5,412,016 | 5/1995 | Sharp . |
| 5,412,160 | 5/1995 | Yasumoto et al. . |
| 5,420,232 | 5/1995 | Dawson et al. . |
| 5,461,003 | 10/1995 | Havemann et al. ............... 437/187 |
| 5,470,801 | 11/1995 | Kapoor et al. ............... 437/238 |
| 5,521,424 | 5/1996 | Ueno et al. ............... 257/760 |
| 5,523,615 | 6/1996 | Cho et al. ............... 257/759 |
| 5,633,034 | 5/1997 | Carter et al. . |

FOREIGN PATENT DOCUMENTS

| | | |
|---|---|---|
| 63-172741 | 7/1988 | Japan . |
| 63-278943 | 11/1988 | Japan . |
| 5205526 | 8/1993 | Japan . |
| 95084538B2 | 9/1995 | Japan . |
| 2006643 | 10/1978 | United Kingdom . |

OTHER PUBLICATIONS

Babich, E. et al., "Low Viscosity and High Temperature Stable Gap Filling Material for Glass/Ceramic Substrates", *IBM Technical Disclosure Bulletin*, 37(7):595–597 (Jul. 1994).

Chujo, Y. et al., "Organic Polymer Hybrids with Silica Gel Formed by Means of the Sol–Gel Method", *Advances in Polymer Science*, 100:11–29 (Feb. 25, 1991).

Hedrick, J., "Poly(aryl ether benzothiazoles)", *Macromolecules*, 24:6361–6364 (1991).

Hilborn, J. et al., "Poly(aryl ether–benzoxazoles)", *Macromolecules*, 23(11):2854–2861 (1990).

(List continued on next page.)

*Primary Examiner*—Charles Bowers
*Assistant Examiner*—Thanh Nguyen
*Attorney, Agent, or Firm*—Robert B. Martin

[57] ABSTRACT

The invention relates to a process for forming an integrated circuit device comprising (i) a substrate; (ii) metallic circuit lines positioned on the substrate and (iii) a dielectric material positioned on the circuit lines. The dielectric material comprises porous organic polysilica.

16 Claims, 2 Drawing Sheets

OTHER PUBLICATIONS

Homma, T. et al., "Stability of a new Polyimide Siloxane Film as Interlayer Dielectrics of ULSI Multilevel Interconnections", *Thin Solid Films*, 235:80–85 (1993).

Joseph, W. et al., "Synthesis of Bis–A Based Polybenzoxazoles via Acid–Catalyzed Solution Cyclization", *Polymer Reprints*, 33(1):501–502 (Apr. 1992).

Joseph, W. et al., "Synthesis of 4,4'–Isopropylidene Diphenol (Bisphenol A) Based Polybenzoxazoles via an Acid–Catalysed Solution Cyclization Process", *Polymer*, 34(4) (1993).

Joseph, W. et al., "Synthesis and Characterization of Fluorinated Polybenzoxazoles via Solution Cyclization Techniques", *Polymer Preprints*, 34(1):397–398 (Mar. 1993).

Joseph, W. et al., "Synthesis and Characterization of Fluorinated Polybenzoxazoles via Solution Cyclization Techniques", *Polymer*, 35(23):5046–5050 (1994).

Mascia, L., "Developments in Organic–Inorganic Polymeric Hybrids: Ceramers", *Trends in Polymer Science*, 3(2):61–66 (Feb. 1996).

McDermott, C., "Foamed Thermoset and Thermoplastic Polymer Combinations", *IBM Technical Disclosure Bulletin*, 8(12):1702 (May 1966).

Morikawa, A. et al., "Preparation of a New Class of Polyimide–Silica Hybrid Films by Sol–Gel Process", *Polymer Journal*, 24(1):107–113 (1992).

Morikawa, A. et al., "Preparation of New Polyimide–Silica Hybrid Materials via the Sol–Gel Process", *J. Mater. Chem.*, 2(7):679–689 (1992).

Munroe, R., "Method for Curing and Holding Semiconductors for Organic Encapsulation", *IBM Technical Disclosure Bulletin*, 27(7A):4037–4038 (Dec. 1984).

Volksen, W., "Condensation Polyimides: Synthesis, Solution Behavior, and Imidization Characteristics", *Advances in Polymer Science*, 117:138–139, 163 (1994).

Volksen, W. et al., "Polyamic Alkyl Esters: Versatile Polyimide Precursors for Improved Dielectric Coatings", *IEEE Transactions on Components, Hybrids and Manufacturing Technology*(IEEE Log No. 9104490) (1992).

Chujo, Y. "Organic/Inorganic Polymer Hybrids", Polymeric Materials Encyclopedia, vol. 6, 1996.

T. Saegusa et al., "An Organic/Inorganic Hybrid Polymer", J. Macromol. Sci.–Chem., A27 (13&14), pp. 1603–1612 (1990).

5,895,263

1

PROCESS FOR MANUFACTURE OF INTEGRATED CIRCUIT DEVICE

FIELD OF THE INVENTION

The present invention relates to a process for manufacturing an integrated circuit device.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to enable closer spacing of circuit lines without increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device. The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide.

It is therefore an object of the present invention to provide an improved integrated circuit device comprising an improved dielectric material.

Other objects and advantages will be apparent from the following disclosure.

SUMMARY OF THE INVENTION

The present invention relates to a process for forming an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises a porous organic polysilica formed by the process of the present invention. Preferably, the dielectric material has pore sizes less than 1000 Å.

A more through disclosure of the present invention is presented in the detailed description which follows and from the accompanying drawings.

DETAILED DESCRIPTION OF THE INVENTION

Figure 1:
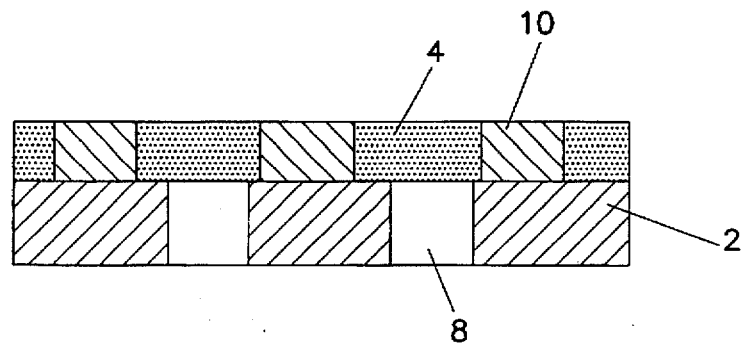
FIG. 1 is a cross-sectional view of a portion of the integrated circuit device formed by the process of the present invention.

An embodiment of the integrated circuit device formed by the process of the present invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the present invention comprises silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers such barrier or adhesion layers (e.g., SiN, TiN).

The key feature of the present invention is forming the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises porous organic polysilica.

Organic polysilica is a polymeric compound comprising silicon, carbon, oxygen and hydrogen atoms. Suitable organic polysilica include (i) silsesquioxanes (ii) partially condensed alkoxysilanes (e.g., partially condensed by controlled hydrolysis tetraethoxysilane having an Mn of about 500 to 20,000); (iii) organically modified silicates having the composition $RSiO_3$ and $R_2SiO_2$ wherein R is an organic substituent and (iv) partially condensed orthosilicates having the composition $SiOR_4$. Silsesquioxanes are polymeric silicate materials of the type $RSiO_{1.5}$ where R is an organic substituent.

Suitable organic polysilica for use in the present invention are known to those skilled in the art. Preferably, the organic polysilica is a silsesquioxane. Suitable silsesquioxanes for the present invention are alkyl (e.g., methyl); aryl (e.g., phenyl) or alkyl/aryl silsesquioxanes which are commercially available (e.g., GR950 from Techniglass, Perrysburg, Ohio). Other suitable silsesquioxanes will be known to those skilled in the art such as disclosed in U.S. Pat. No. 5,384, 376, and Chem. Rev. 95, 1409–1430 (1995), the disclosure of which are incorporated herein by reference for all purposes.

The porous organic polysilica dielectric composition is formed in a three step process. The first step involves dissolving uncondensed or partially condensed organic polysilica in a suitable high boiling solvent (e.g., N-methyl-2-pyrrolidone, NMP) at room temperature and then uniformly dispersing in the solution a suitable decomposable polymer. The decomposable polymer is radiation decomposable or preferably thermally decomposable. The radiation decomposable polymer decomposes upon exposure to radiation e.g., ultraviolet, x-ray, electron beam or the like. The thermally decomposable polymer undergoes thermal decomposition at a temperature above the condensation temperature of the organic polysilica. Suitable decomposable polymers include linear polymers, crosslinked polymeric nanospheres, block copolymers and hyperbranched polymers. Suitable linear polymers are polyethers such as poly(propylene oxide), polyacrylates such as poly(methyl methacrylate), aliphatic polycarbonates e.g., poly(propylene carbonate), poly(ethylene carbonate, polyesters, polysulfones and polystyrene or poly (α methyl styrene). The decomposable linear polymer will preferably have reactive end groups which will react (co-condense) with the organic polysilica such as a triethoxysilane, hydroxy, carboxy, or amino group. Suitable crosslinked, insoluble nanospheres (prepared as nanoemulsions) are suitably comprised of polystyrene or poly(methyl methacrylate). Suitable block copolymers are poly(styrene-ethylene oxide), poly(ether-lactones), poly(ester-carbonates) and poly(lactone-lactide). These block copolymers self organize to form micelles. Suitable hyperbranched polymers are hyperbranched polyester, e.g., hyperbranched poly(caprolactone), polyethers e.g., polyethylene oxide polypropylene oxide. Organic hyperbranched polymers are highly branched, three-dimensional, globular-shaped macromolecules which have reactive groups at the chain ends with a substantial number of reactive groups along the outer surface of the macromolecule. Preferably, the surface reactive groups are condensable with the organic polysilica. Hyperbranched polymers are formed by polycondensation of a multifunctional monomer $(A)_nRB$ wherein A is a coupling group which is reactive with B, R is nonreactive organic spacer and n>1 preferably n=2–5 and more preferably n=2–4.

Suitably, the hyperbranched polymer is polydispersed in both molecular weight and branching. Hyperbranched polymers have low solution viscosity, high chemical reactivity due to surface functionality and enhanced solubility even at higher molecular weights. Suitable decomposable hyperbranched polymers for use in the present invention will be known to those skilled in the art such as disclosed in "Comprehensive Polymer Science", 2nd Supplement, Aggarwal, pages 71–132 (1996), the disclosure of which is incorporated herein by reference for all purposes.

In the second step of the process of the present invention, the mixture of the organic polysilica and decomposable polymer is heated to an elevated temperature e.g., directly or in a step wise fashion (e.g., 200° C. for 2 hrs. and then ramped up (5° C./min.) to 300° C. and held for 2 hrs.) to cause condensation of the organic polysilica and preferably cross condensation with the reactive group of the thermally decomposable polymer. The heating in the second step is below the thermal decomposition temperature of the decomposable polymer. A catalyst may be utilized to lower the condensation temperature.

The last step of the process of the present invention involves decomposing the decomposable polymer uniformly dispersed within the matrix of the condensed rigid organic polysilica. Photochemical labile polymer can be decomposed by exposure of the composition to suitable radiation to cause photodecomposition. Thermally decomposable polymer is decomposed by heating the composition to a temperature at or above the thermal decomposition temperature of the polymer. (e.g., about 350–400° C.).

The decomposable polymer decomposes to volatile fragments which diffuse out of the rigid polysilica matrix leaving voids behind. The pore size in the polysilica matrix will be generally the same size as the size of the domains of the decomposable polymer and the pore size can be altered by varying the molecular weight of the decomposable polymer.

The dielectric composition of the present invention has a dielectric constant less than 3.2 and preferably less than 2.8 at 25° C. The composition comprises about 10 to 40% by volume of pores and has pore sizes less than 1000 Å, preferably less than 500 Å, which result in enhanced mechanical toughness and crack resistance and isotropic optical properties and improved dielectric properties. Further the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage after removal of the solvent during heating. The composition of the present invention can also be utilized as a protective coating for optical articles such as glasses, contact lens and solar reflectors and other articles used in outer space.

Figure 2:
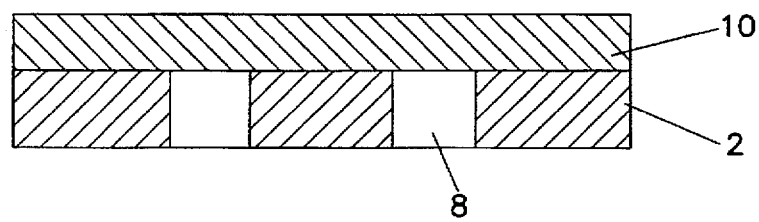
FIGS. 2–5 show a process for making the integrated circuit device of the present invention.

The present invention relates to processes for manufacturing the integrated circuit device. Referring to FIG. 2, the first step of one process embodiment involves disposing on a substrate 2 a layer 10 of the dielectric composition of the present invention comprising organic polysilica and decomposable polymer. The substrate 2 is shown with vertical metallic studs 8. The composition is dissolved in a suitable solvent such as dimethyl propylene urea (DMPU), NMP or the like and is applied to the substrate by art known methods such as spin or spray coating or doctor blading. The second step of the process involves heating the composition to an elevated temperature to cross condense the polysilica silyl reactive groups. Preferably, the composition is heated in the presence of a base such as an amine or Bronsted base to lower the condensation temperature. The base catalyzes both condensation extension of the polysilica and any cross condensation with the decomposable polymer enabling a lower initial cure temperature. Suitably, the base is an organic amine. The amine will preferably have a high boiling point and is removable by heating upon completion of the reaction. A suitable base is N-methyl-diethanolamine. Other suitable bases will be known to those skilled in the art such as disclosed in U.S. Pat. No. 5,206,117, the disclosure of which is incorporated herein by reference for all purposes. The last step involves decomposing the decomposable polymer dispersed within the rigid polysilica matrix to form the porous polysilica.

Figure 3:
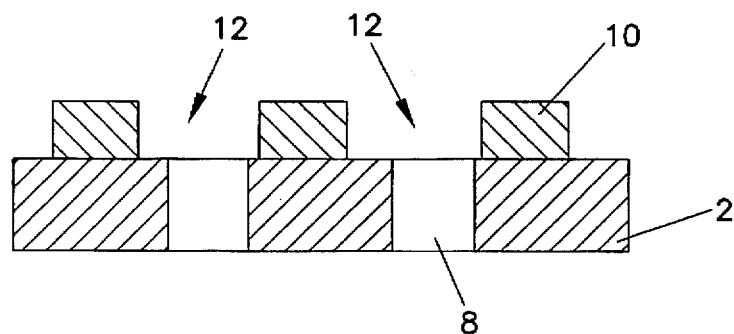

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible UV or deep UV, (iii) developing the image in the resist e.g., with suitable basic developer and (iv) transferring the image through the layer 10 of dielectric composition to the substrate 2 with a suitable transfer technique such as reactive ion etching. (RIE) Suitable lithographic patterning techniques are well known to those skilled in the art such as disclosed in "Introduction to Microlithography", Thompson et al., (1994), the disclosure which is incorporated herein by reference for all purposes.

Figure 4:
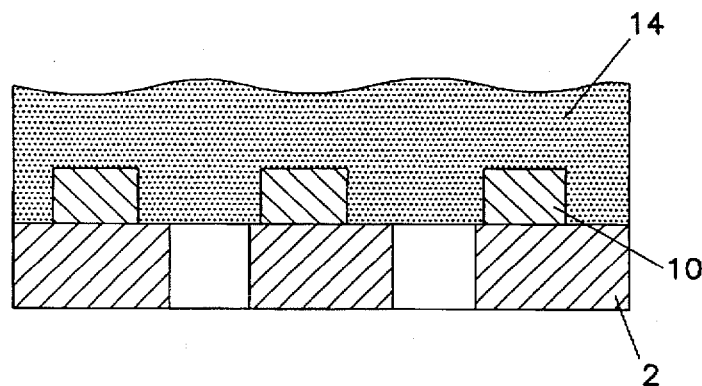

Referring to FIG. 4, in the next step of the process for forming the integrated circuit of the present invention, a metallic film 14 and removing excess metal) is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
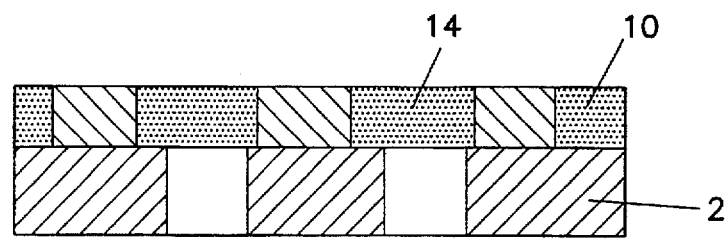

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
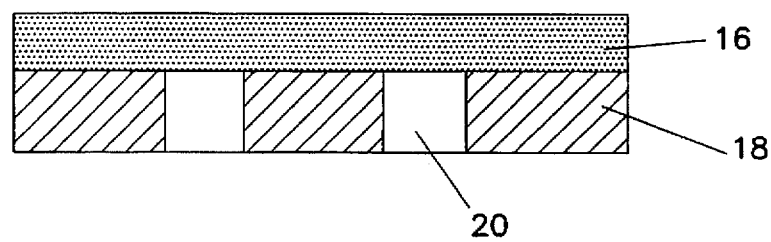
FIGS. 6–8 show an alternative process for making the integrated circuit device of the present invention.
Figure 7:
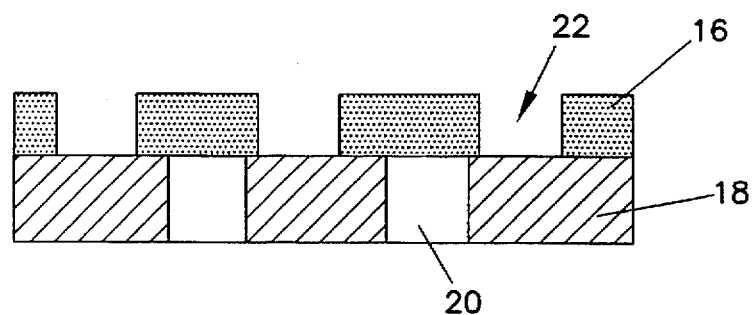
Figure 8:
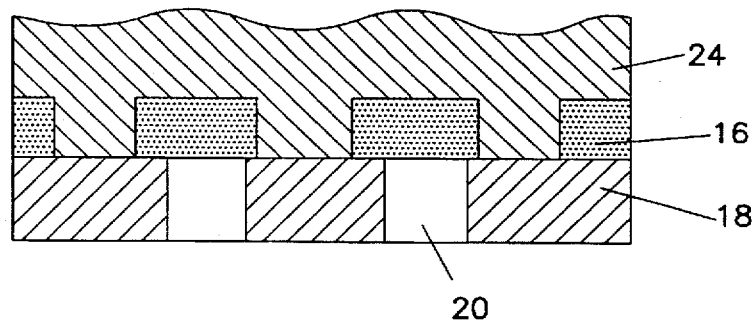

Referring FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated first to condense the polysilica and then at a higher temperature to decompose the thermally decomposable polymer. Optionally, the dielectric layer may then be planarized for subsequent process in a multilayer integrated circuit.

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

The ring opening polymerization of poly(caprolactone) using aluminum alkoxides as initiators enables control of molar mass, molar mass distribution and the chain ends. Kricheldorf[1], Dubois[2] and others, describe the ring opening of poly(caprolactone) with terminal hydroxyl groups. This procedure was followed to make hydroxyl functional poly(caprolactones) which were functionalized with 3-isocyanato-propyltriethoxysilane[4].

The triethoxysilane functional poly(caprolactone) and spin on glass, SOG, resin (either 950F or 650F (Techniglass)) were dissolved in NMP, cast and cured to 180° C. (2 hours) followed by a post cure to 300° C. (2 hours) to effect rigid network formation. The films were then heated to 400° C. (3 hours) to effect the decomposition of the aliphatic polyester block.

EXAMPLE 2

Branched polyesters derived from 2,2'-bis (hydroxymethyl) propionic acid (Bis-MPA)[5] were self-polymerized in the melt in the presence of acid by a procedure described by Hult et al.[5] The hyroxyl end groups were then functionalized with 3-isocyanato-propyltriethoxysilane by a procedure described by Dubois. The functionalized polyesters were used to form porosity in SOG resins using the procedure described above.

REFERENCES:
1. Kricheldorf, H. R.; Kreiser-Saunders, I; Schamagl, N., *Makramol Chem. Macromol Symp.*, 1990, 32, 285.
2. Dubois, P.; Jerome, R.; Teyssie, P., *Macromolecules*, 1991, 24, 977.
3. Tian, D.; Dubois, P.; Jerome, R.; Teyssie, P., *Macromolecules*, 1994, 27, 4134.
4. Tian, D.; Dubois, P.; Jerome, R.; *Polymer*, 1996, 37, 3983.
5. Ihre, H.; Johnson, M.; Malstrom, E.; and Hult, A., *Adv. in Dendritic Macromol.*, 3, 1, (1996).

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit comprising:

(a) positioning on a substrate a layer of dielectric composition, the composition comprising decomposable polymer and organic polysilica;

(b) heating the composition to condense the polysilica;

(c) decomposing the decomposable polymer to form a porous dielectric layer;

(d) lithographically patterning the dielectric layer;

(e) depositing a metallic film onto the patterned dielectric layer; and (f) planarizing the film to form the integrated circuit.

2. The process of claim 1 wherein the decomposable polymer is decomposed by heating or exposure to radiation.

3. The process of claim 2 wherein the organic polysilica is silsesquioxane.

4. The process of claim 3 wherein the silsesquioxane is alkyl/phenyl silsesquioxane.

5. The process of claim 2 wherein the decomposable polymer is a linear polymer selected from polyester, polystyrene, poly(α-methylstyrene) polyacrylate or polymethacrylate.

6. The process of claim 2 wherein the decomposable polymer is a crosslinked polymeric nanosphere.

7. The process of claim 2 wherein the decomposable polymer is hyperbranched polymer.

8. The process of claim 7 wherein the hyperbranched polymer is polyester.

9. A process for forming an integrated circuit comprising:

(a) depositing a metallic film on a substrate;

(b) lithographically patterning the metallic film;

(c) depositing on the patterned metallic film, a layer of a dielectric composition comprising decomposable polymer and organic polysilica;

(d) heating the composition to condense the polysilica; and (e) decomposing the decomposable polymer to form a porous dielectric layer.

10. The process of claim 9 wherein the decomposable polymer is decomposed by heating or exposure to radiation.

11. The process of claim 10 wherein the organic polysilica is silsesquioxane.

12. The process of claim 11 wherein the silsesquioxane is alkyl/phenyl silsesquioxane.

13. A process of claim 10 wherein the decomposable polymer is a linear polymer selected from polyester, polystyrene, poly(α-methylstyrene), polyacrylate or polymethacrylate.

14. The process of claim 10 wherein the decomposable polymer is a crosslinked polymeric nanosphere.

15. The process of claim 10 wherein the decomposable polymer is hyperbranched polymer.

16. The process of claim 15 wherein the hyperbranched polymer is polyester.

* * * * *